United States Patent
Ha

(10) Patent No.: US 9,559,298 B2
(45) Date of Patent: Jan. 31, 2017

(54) SEMICONDUCTOR MEMORY WITH A MULTI-LAYER PASSIVATION LAYER FORMED OVER SIDEWALLS OF A VARIABLE RESISTANCE ELEMENT

(71) Applicant: SK hynix Inc., Icheon-Si (KR)

(72) Inventor: Ga-Young Ha, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 116 days.

(21) Appl. No.: 14/157,505

(22) Filed: Jan. 16, 2014

(65) Prior Publication Data

US 2015/0092482 A1 Apr. 2, 2015

(30) Foreign Application Priority Data

Sep. 30, 2013 (KR) ........................ 10-2013-0116253

(51) Int. Cl.
| | |
|---|---|
| *G11C 13/00* | (2006.01) |
| *H01L 45/00* | (2006.01) |
| *H01L 43/02* | (2006.01) |
| *H01L 43/08* | (2006.01) |
| *H01L 43/12* | (2006.01) |
| *G11C 11/16* | (2006.01) |

(52) U.S. Cl.
CPC ............... *H01L 45/06* (2013.01); *H01L 43/02* (2013.01); *H01L 43/08* (2013.01); *H01L 43/12* (2013.01); *H01L 45/08* (2013.01); *H01L 45/12* (2013.01); *H01L 45/1233* (2013.01); *H01L 45/1675* (2013.01); *G11C 11/161* (2013.01); *G11C 13/0004* (2013.01); *G11C 13/0007* (2013.01)

(58) Field of Classification Search
CPC ............. G11C 13/0011; G11C 13/0004; G11C 13/0007; G11C 13/0009; G11C 11/5607; G11C 11/5614; G11C 11/5678; G11C 11/5685; G11C 11/15; G11C 11/14; G11C 11/16; G11C 11/161; G11C 2213/34; H01L 27/2418; H01L 27/2427; H01L 45/06; H01L 45/085
See application file for complete search history.

(56) References Cited

U.S. PATENT DOCUMENTS

| 7,745,231 B2 * | 6/2010 | Liu ..................... G11C 13/0004 257/E21.008 |
| 8,105,884 B2 * | 1/2012 | Lee ..................... G11C 13/0007 438/102 |

FOREIGN PATENT DOCUMENTS

KR 10-1223724 B1 1/2013

* cited by examiner

*Primary Examiner* — Andrew Q Tran
(74) *Attorney, Agent, or Firm* — Perkins Coie LLP

(57) ABSTRACT

An electronic device includes a semiconductor memory, wherein the semiconductor memory includes a variable resistance element formed over a substrate, and a multi-layer passivation layer positioned over sidewalls of the variable resistance element and having two or more insulating layers formed over the sidewalls of the variable resistance element.

15 Claims, 9 Drawing Sheets

SEMICONDUCTOR MEMORY WITH A MULTI-LAYER PASSIVATION LAYER FORMED OVER SIDEWALLS OF A VARIABLE RESISTANCE ELEMENT

CROSS-REFERENCE TO RELATED APPLICATIONS

The present application claims priority of Korean Patent Application No. 10-2013-0116253, entitled "ELECTRONIC DEVICE AND METHOD FOR FABRICATING THE SAME" and filed on Sep. 30, 2013, which is incorporated herein by reference in its entirety.

TECHNICAL FIELD

This patent document relate to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor devices have been conducted. Examples of such semiconductor devices include semiconductor devices which may store data using a characteristic that switched between different resistance states according to an applied voltage or current, and can be implemented in various configurations, for example, a resistive random access memory (RRAM), a phase change random access memory (PRAM), a ferroelectric random access memory (FRAM), a magnetic random access memory (MRAM), an E-fuse, etc.

SUMMARY

The disclosed technology in this patent document includes memory circuits or devices and their applications in electronic devices or systems and various implementations of an electronic device which is capable of improving the reliability of a variable resistance element.

In one aspect, an electronic device includes a semiconductor memory, wherein the semiconductor memory includes: a variable resistance element formed over a substrate; and a multi-layer passivation layer positioned over sidewalls of the variable resistance element and having two or more insulating layers formed over the sidewalls of the variable resistance element.

Implementations of the above electronic device may include one or more the following.

Each of the two or more insulating layers may comprise nitride. Each of the two or more insulating layers may be a thin film formed through a deposition and a post-treatment. Among the two or more insulating layers of the multi-layer passivation layer, a first insulating layer of the multi-layer passivation layer may have a first impurity concentration higher than a second impurity concentration of a second insulating layer positioned closer than the first insulation layer to the variable resistance element. The variable resistance element may comprise a stacked layer of two magnetic layers and a tunnel barrier layer interposed therebetween. The variable resistance element may comprise metal oxide. The variable resistance element may comprise a phase change material. The insulating layer may comprise silicon nitride.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is a part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is a part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor may perform the operation using the program and the information when executing the program; and an interface device configured to perform communication between at least one of the processor, the auxiliary memory device and the main memory device and the outside, wherein the semiconductor memory unit that includes the variable resistance element is a part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is a part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is a part of the memory or the buffer memory in the memory system.

In another aspect, an electronic device includes: a variable resistance element formed over a substrate and comprising a stacked layer of two magnetic layers and a tunnel barrier layer interposed therebetween; a multi-layer passivation layer formed over sidewalls of the variable resistance element and including two or more insulating layers perpendicular to the stacked layer of two magnetic layers and a tunnel barrier layer; and a reduction region formed between the multi-layer passivation layer and one of the sidewalls of the variable resistance element to reduce an amount of an oxidation material on the sidewalls.

Implementations of the above electronic device may include one or more the following.

Among the two or more insulating layers of the multi-layer passivation layer, a first insulating layer may have a first impurity concentration higher than a second impurity concentration of a second insulating layer positioned closer than the first insulating layer to the variable resistance element. The insulating layer may comprise silicon nitride.

In another aspect, an electronic device includes a variable resistance pattern formed over a substrate and comprising a stacked layer of two magnetic layers with a tunnel barrier layer interposed therebetween; and a multi-layer passivation layer positioned over sidewalls of the variable resistance pattern and having two or more insulating layers stacked over the sidewalls of the variable resistance pattern, wherein the edge of the variable resistance pattern contacted with the multi-layer passivation layer has a reduction region.

In another aspect, a method for fabricating an electronic device includes: forming a variable resistance element over a substrate; and forming a multi-layer passivation layer over sidewalls of the variable resistance element, the multi-layer passivation layer having a plurality of insulating layers formed over the sidewalls of the variable resistance element, wherein the forming a multi-layered passivation layer comprises repeatedly performing a forming of an insulating layer and a post-treating of the formed insulating layer.

Implementations of the above method may include one or more the following.

The method may further comprise: performing oxidation to remove residues on the sidewalls of the variable resistance element, before the multi-layer passivation layer is formed. The performing of the oxidation may cause a dead layer to form on the sidewalls of the variable resistance element and after the forming of the dead layer may further comprise: forming a reduction region by removing the dead layer. The forming of the reduction region may be performed through a plasma treatment or radical treatment using a gas mixture of $H_2$ and $N_2$. The post-treatment may comprise a plasma treatment or radical treatment using a gas mixture of $H_2$ and $N_2$.

In yet another aspect, a method for fabricating an electronic device includes: forming a variable resistance element having layers over a substrate; and repeating a deposition process and a post-treatment process to form a multi-layer passivation layer including insulating layers on sidewalls of the variable resistance element, wherein the insulating layers of the multi-layered passivation layer are perpendicular to the layers of the variable resistance element.

Implementations of the above method may include one or more the following.

The method may further comprise: performing an oxidation process to remove residues formed during the forming of the variable resistance element, thereby forming a dead layer on the sidewalls of the variable resistance element; and performing a removing process of the dead layer, thereby forming a reduction region on the sidewalls of the variable resistance element, wherein the area of the reduction region is repeatedly reduced due to the repeating of the deposition process and the post-treatment process. The repeating of the deposition process and the post-treatment process may comprise: forming a first insulating layer on the sidewalls of the variable resistance element; forming a second insulating layer to be positioned adjacent to the insulating layer; and forming a third insulating layer to be positioned adjacent to the second insulating layer, wherein the first, second, and third insulating layers are arranged in order in a direction away from the variable resistance element. The repeating of the deposition process and the post-treatment process may comprise repeatedly removing impurities remained in each layer of the multi-layered passivation layer.

These and other aspects, implementations and associated advantages are described in greater detail in the drawings, the description and the claims.

DETAILED DESCRIPTION

Figure 1:
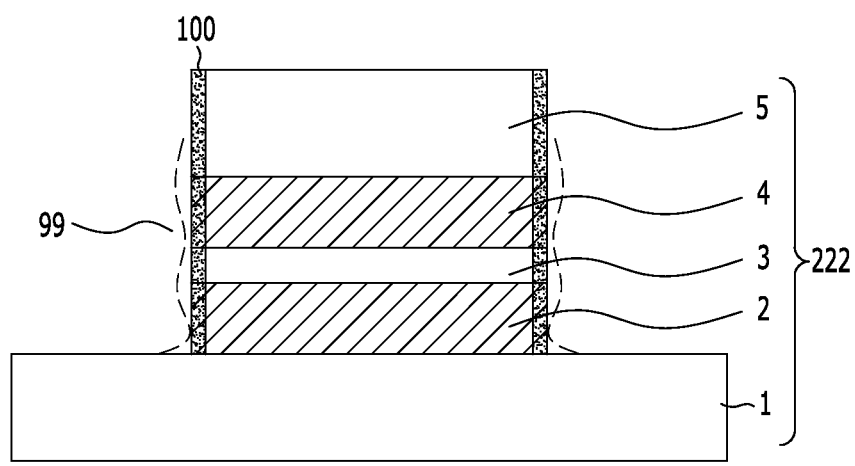
FIG. 1 is a cross-sectional view of a semiconductor device including a variable resistance pattern.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

During the fabrication of an electronic device including a variable resistance pattern, a surface treatment is performed on the variable resistance pattern to reduce the surface area of the variable resistance pattern and remove residues formed during the fabrication of an electronic device. Furthermore, when a multi-layered passivation layer is formed, a process of reducing an oxidized variable resistance pattern and removing impurities within the passivation layer may be repeatedly performed.

FIG. 1 is a cross-sectional view of an example of a semiconductor device including a variable resistance pattern as part of a semiconductor memory device.

Referring to FIG. 1, the semiconductor device includes a variable resistance pattern 222 interposed between a lower contact (not illustrated) and an upper contact (not illustrated).

The lower contact may be connected to one end of an element formed in a substrate (not illustrated), for example, a switching element (not illustrated), and the other end of the switching element may be connected to a source line (not illustrated). Furthermore, the upper contact may be connected to a bit line (not illustrated). The variable resistance pattern 222 may be arranged under the upper contact, and may include an under layer 1 for improving the characteristic or process of the variable resistance pattern 222, a storage layer 2 having a changeable magnetization direction, a tunnel barrier layer 3, a reference layer 4 having a pinned magnetization direction, and a hard mask layer 5 for patterning the variable resistance pattern 222. The under layer 1, the storage layer 2, the tunnel barrier layer 3, the reference layer 4, and the hard mask layer 5 are sequentially stacked.

Such a semiconductor device may be fabricated through the following series of processes.

First, the under layer 1, the storage layer 2, the tunnel barrier layer 3, and the reference layer 4 are sequentially formed. Then, the hard mask layer 5 is formed over the reference layer 4, and used as an etch barrier to sequentially etch the reference layer 4, the tunnel barrier layer 3, the storage layer 2, and the under layer 1, thereby forming the variable resistance pattern 222.

At this time, the etching process may be performed through a physical etching process because the variable resistance pattern 220 is formed of a solid material.

During the physical etching process, a target material is physically cut by having atoms collide with the material, and the cut material may adhere on the sidewalls of the variable resistance pattern 222. That is, re-deposition may occur. This is because a conductive residue generated during the etch process, for example, a polymer residue, is not easily volatilized since magnetic substances used for forming the variable resistance pattern 222 have a high boiling point.

Referring to FIG. 1, a re-deposited layer 99 is formed through a re-deposition process. Such a re-deposited layer 99 causes a shunt fail due to an electrical short between the storage layer 2 and the reference layer 4 of the variable resistance pattern 222. In order to address this problem, the re-deposited layer 99 formed on the sidewalls of the variable resistance pattern 22 needs to be oxidized during or after the variable resistance pattern 222 is patterned. The oxidization of the re-deposited layer 99, however, may cause the followings: the sidewalls of the variable resistance pattern 222 are also simultaneously oxidized and the edges of the storage layer 2 and the reference layer 4 are unexpectedly oxidized. As a result of this undesired oxidation, a dead layer 100 is formed over the sidewalls of the variable resistance pattern 222. Such a dead layer 100 formed through the oxidation may degrade the characteristic of the variable resistance pattern 222. For example, the resistance of the variable resistance pattern 222 may be increased.

Figure 2:
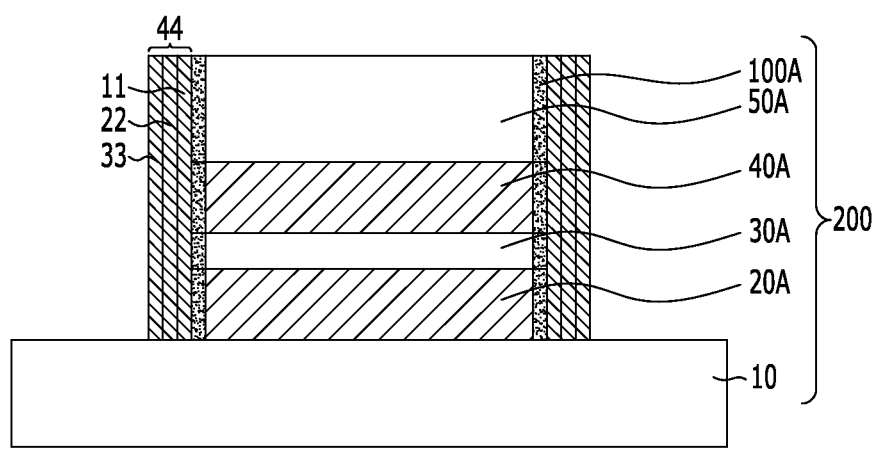
FIG. 2 is a diagram illustrating a semiconductor device.

FIG. 2 is a diagram illustrating an example of a semiconductor device in accordance with an implementation that implements a passivation layer structure on the sidewalls.

Referring to FIG. 2, the semiconductor device may include a variable resistance pattern 200 and a multi-layer passivation layer 44. The multi-layer passivation layer 44 is formed on the sidewalls of the variable resistance pattern 200 and includes two or more post-treated insulating layers 11, 22, and 33 stacked on the sidewalls of the variable resistance pattern 200. Hence, the layers included in the multi-layer passivation layer 44 are perpendicular to the layers 20A, 30A and 40A of the variable resistance pattern 200.

The variable resistance pattern 200 may include a storage layer 20A having changeable magnetization direction, a tunnel barrier layer 30A, and a reference layer 40A having a pinned magnetization direction. The resistance of the variable resistance pattern 200 can change between a high resistance value and a low resistance value based on the magnetization direction of the storage layer 20 relative to the pinned magnetization direction of the reference layer 40.

In implementations, the multi-layer passivation layer 44 may include a plurality of insulating layers 11, 22, and 33. Each of the insulating layers 11, 22, and 33 may be formed as a thin film by a deposition and a post treatment. Furthermore, the post treatment may include a plasma treatment or radical treatment using a gas mixture of $H_2$ and $N_2$.

In one embodiment, the plurality of insulating layers 11, 22, and 33 of the multi-layer passivation layer 44 may be formed by performing a plurality of cycles each including a deposition and a post treatment.

The impurity concentrations of the post-treated insulating layers 11, 22, and 33 may differ depending on the positions of the insulating layers. For example, among the insulating layers, the third insulating layer 33 positioned away from the variable resistance pattern 200 may have an impurity concentration higher than the first insulating layer 11 positioned closer to the variable resistance pattern 200.

Furthermore, as the number of stacked insulating layers forming the multi-layer passivation layer 44 increases, the magnitude of the stress associated with the multi-layer passivation layer 44 may increase.

The variable resistance pattern 200 may further include a reduction region 100A formed at the edge thereof and on the sidewalls of the variable resistance pattern 200. The reduction region 100A may be formed by reducing a dead layer (100' of FIG. 1) which is formed during an oxidation process for removing residues generated during a process for patterning the variable resistance pattern 200.

Furthermore, the reduction degree of the reduction region 100A may be increased as the multi-layer passivation layer 44 is formed on the sidewalls of the variable resistance pattern 200.

Figure 3:
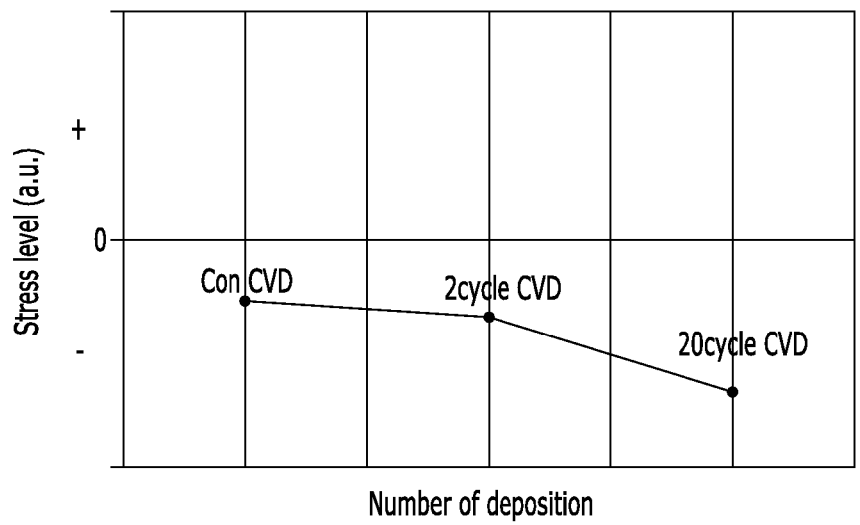
FIG. 3 is a graph illustrating changes of stress level depending on the number of times of a deposition process of insulating layers during a fabrication of a multi-layer passivation layer.

FIG. 3 is a graph illustrating changes of stress level depending on the number of times of deposition performed on insulating layers during a fabrication of the multi-layer passivation layer 44.

FIG. 3 illustrates the stress level between the variable resistance pattern 200 and the multi-layer passivation layer 44. As the number of deposition cycles for insulating layers increases, the stress level increases. For reference, the stress level indicates an absolute value from a center, i.e., a zero point. Thus, the variable resistance pattern 200 having the multi-layer passivation layer 44 may be formed to offset a stress imbalance, thereby preventing the degradation of characteristic in the variable resistance pattern 200. Furthermore, the multi-layer passivation layer 44 may be formed as hard and dense structure to better offset the undesired stress imbalance.

Figure 4:
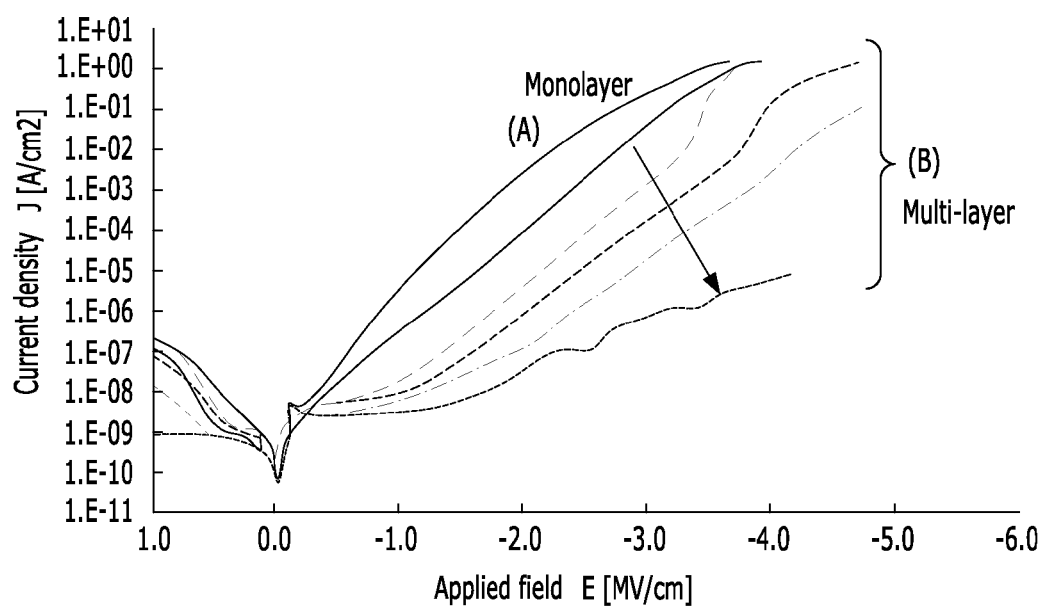
FIG. 4 illustrates the film leakage current of the variable resistance pattern having the multi-layered passivation layer.

FIG. 4 illustrates an example of dependence of the film leakage current of the variable resistance pattern 200 having the multi-layer passivation layer with respect to the applied electric field.

Referring to FIG. 4, a variable resistance pattern 200 having a mono-layer is indicated by a solid line (A), and the variable resistance pattern 200 having the multi-layer passivation layer with two or more insulating layers is indicated by a dotted line (B). In FIG. 4, the arrow indicates that the number of times of a deposition process increases while a plasma treatment time is decreased. Referring to FIG. 4, the film leakage current decreases with the increase of the number of times of a deposition process.

Accordingly, the multi-layer passivation layer 44 has a dense film quality, and the variable resistance pattern 200 with high reliability can be formed. As the multi-layer passivation layer 44 is formed, the film leakage current may significantly decrease, and thus, the variable resistance pattern 200 can be protected from outside by the multi-layer passivation layer 44.

FIGS. 5A to 5F are diagrams for explaining an example of a method for fabricating a semiconductor device.

Figure 5A:
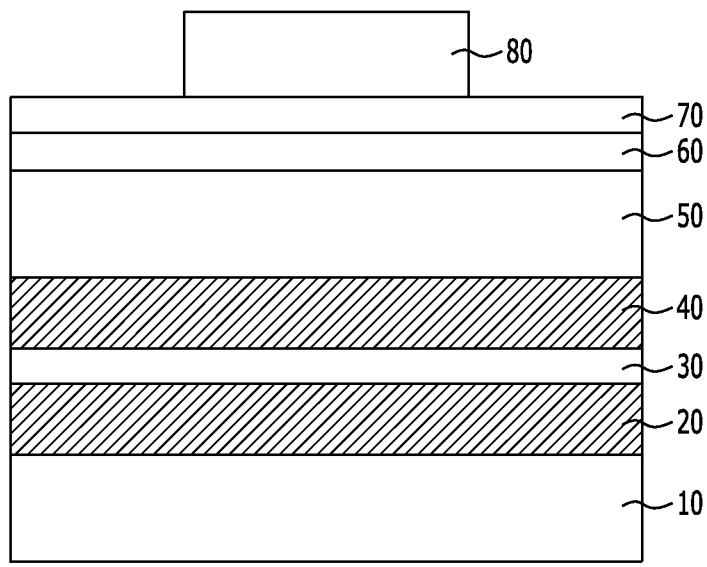
FIGS. 5A to 5G are diagrams for explaining a method for fabricating a semiconductor device.

Referring to FIG. 5A, a substrate (not illustrated) having a predetermined lower layer (not illustrated) formed therein is prepared. The lower layer may include a switching element (not illustrated) for selecting a variable resistance pattern. The switching element may include a transistor, a diode, and the like, for example. Furthermore, the lower layer may include a contact plug formed to connect the variable resistance pattern to a junction region, and the contact plug may include a bottom electrode for supplying a current to the variable resistance pattern.

The variable resistance pattern may be formed over the substrate. The variable resistance pattern may exhibit a variable resistance characteristic according to a bias applied to a top electrode and the bottom electrode (not illustrated), and include a mono-layer or multi-layer. For example, the variable resistance pattern may include a phase change material which exhibits a variable resistance characteristic. The phase change material may include a chalcogen compound. The crystalline state of the phase change material is changed to an amorphous state or crystal state according to an external stimulus (for example, voltage or current), and may have a characteristic of switching between different resistance states.

The variable resistance pattern may include metal oxide. The metal oxide may include transition metal oxide (TMO), perovskite-based oxide, and the like. The metal oxide may include vacancies, and have a characteristic of switching between different resistance states through generation/disappearance of a conductive path depending on the behavior of vacancies by an external stimulus.

The variable resistance pattern may include a stacked layer of two magnetic layers, such as a storage layer 20A and a reference layer 40A, and a tunnel barrier layer 30A interposed between the two magnetic layers. The stacked layer of two magnetic layers and the tunnel barrier layer 30A interposed therebetween may be referred to as a magnetic tunnel junction (MTJ) element. The stacked layer of two magnetic layers with the tunnel barrier layer 30A interposed therebetween may have a characteristic of switching between different resistance states according to the magnetization directions of the two magnetic layers. For example, when the magnetization directions of the two magnetic layers are identical to each other (or parallel to each other), the stacked layer may have a low-resistance state, and when the magnetization directions of the two magnetic layers are different from each other (or anti-parallel to each other), the stacked layer may have a high-resistance state.

Various materials may be applied as the variable resistance pattern as long as the materials may satisfy a variable resistance characteristic of switching between different resistance states according to a bias applied to a top electrode or a bottom electrode or both. Various configurations can be made for the variable resistance pattern. As one implementation example, the variable resistance pattern can include an MTJ structure including two magnetic layers and the tunnel barrier layer 30A interposed therebetween.

The method for fabricating the variable resistance pattern will be described in detail.

An under layer 10 may be formed over the substrate. The under layer 10 may serve to improve the normal anisotropy of the MTJ structure. For example, the under layer 10 may serve to control the crystallinity of magnetic layers positioned over the under layer 10. The under layer 10 may include a mono-layer or multi-layer containing a metal such as Cr, Mo, Ta, Ru, Co, Fe, B, Cu, Ti, V, or P, metal nitride thereof, or metal oxide thereof. Various conductive materials can be used for the under layer 10.

The storage layer 20 is formed over the under layer 10. The storage layer 20 may function as a magnetic layer of which the magnetization direction is varied according to the direction of a current applied to the variable resistance element. The storage layer 20 may have a stacked structure of one or more elements including Fe, Co, and Ni or an alloy containing element and one element including Cr, Pt, Pd, Ir, Rh, Os, Re, Au and Cu or an alloy containing one element. For example, the storage layer 20 may include Co/Pt, Co/Pd, CoCr/Pt, Co/Ru, Co/Os, Co/Au, Ni/Cu and the like. However, other implementations are possible.

Furthermore, before the storage layer 20 is formed, the tunnel barrier layer 30 is formed over the storage layer 20, and may be formed of MgO or $Al_2O_3$.

The reference layer 40 is formed over the tunnel barrier layer 30. The reference layer 40 may function as a magnetic layer having a pinned magnetization direction, and may include a mono-layer or multi-layer containing Co, Fe, Fe—Pt alloy, Fe—Pd alloy, Co—Pd alloy, Co—Pt alloy, Co—Fe alloy, Fe—Ni—Pt alloy, Co—Fe—Pt alloy, Co—Ni—Pt alloy or the like. When the reference layer 40 is formed as a multi-layer including two or more ferromagnetic material layers, a metal layer such as Pt or Pd may be interposed between the ferromagnetic material layers. However, other implementations are possible.

Under the reference layer 40, a Co/Fe/B (CFB) layer (not illustrated) may be provided as a ferromagnetic material. At this time, specific combinations of the reference layer 40 and the CFB layer can be made, which include, for example, (Co/Pt)n/CoFeB, FePt/CoFeB, and CoPt/CoFeB. The combination of (Co/Pt)n indicates a structure in which the stacked Co and Pt are alternately repeated.

The resistance value of the variable resistance pattern changes according to the magnetization directions of the reference layer 40 and the storage layer 20. Such a characteristic may be used to store data. For example, the magnetization directions of the reference layer 40 and the storage layer 20 become parallel to each other or anti-parallel to each other according to a current supplied through a lower contact (not illustrated) or upper contact (not illustrated). When the magnetization directions are parallel to each other, the magnetic resistance pattern may have a low resistance state to store data '0'. On the other hand, when the magnetization directions are anti-parallel to each other, the variable resistance pattern may have a high resistance state to store data '1'.

A hard mask layer 50 is disposed over the reference layer 40. The hard mask layer 50 may include insulating materials, for example, oxide, nitride, and oxynitride or a stacked layer thereof. Furthermore, the hard mask layer 50 may be formed of a metallic layer. The metallic layer may include titanium (Ti), tantalum (Ta), platinum (Pt), copper (Cu), tungsten (W), aluminum (Al), titanium nitride (TiN), tantalum nitride (TaN), tungsten silicide (WSi) and the like.

Then, an etch barrier layer 60, an anti-reflection layer 70, and a mask pattern 80 may be sequentially formed over the hard mask layer 50.

The etch barrier layer 60 is a thin film for increasing an etch margin of the mask pattern 80. The etch barrier layer 60 is formed for the case that the hard mask layer 50 is etched through other techniques than using the mask pattern 80. The etch barrier layer 60 may be formed of an amorphous carbon layer.

The anti-reflection layer 70 may be formed to prevent the change of the shape of the mask pattern 80, which is caused by reflection of light during a process for forming the mask pattern 80 including an exposure process. The anti-reflection layer 70 may be formed of silicon nitride ($Si_3N_4$).

The mask pattern 80 is a thin film for defining the shape of the variable resistance pattern. One mask pattern 80 may define the shape of one variable resistance pattern. If a plurality of mask patterns 80 are provided, each of the mask patterns 80 may have the same size. The mask pattern 80 may be formed of photo-resist materials.

Figure 5B:
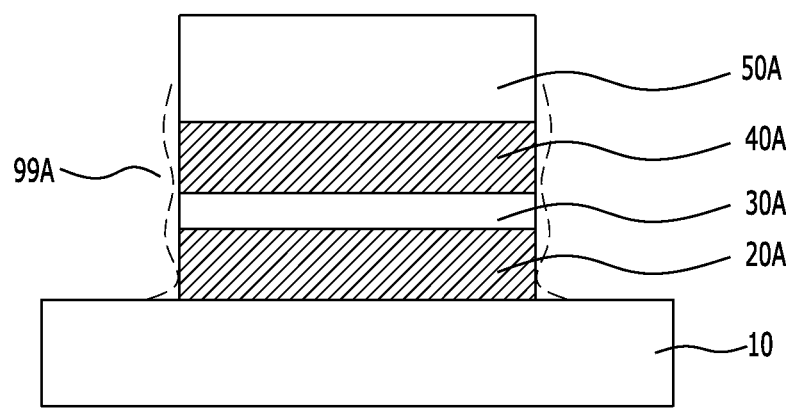

FIG. 5B is a diagram for explaining an etch process for forming the thin films stacked during the fabrication process of the variable resistance pattern.

Referring to FIG. 5B, an etch process may be performed to form a hard mask layer pattern 50A, and a physical etch process may be used to form the variable resistance pattern.

The mask pattern 80 (shown in FIG. 5A) may be used as an etch barrier to etch the anti-reflection layer 70 (shown in FIG. 5A) and the etch barrier layer 60 (shown in FIG. 5A). At this time, a part or all of the mask pattern 80 and the anti-reflection layer 70 may be removed. If necessary, a process for removing the mask pattern 80 and the anti-reflection layer 70 may be separately performed.

Then, the etched etch barrier layer 60 may be used to etch the hard mask layer 50 (shown in FIG. 5A), thereby forming the hard mask pattern 50A. At this time, a part or all of the etch barrier layer 60 may be removed. If necessary, a process for removing the etch barrier layer 60 may be separately performed.

Using the hard mask layer pattern 50A as an etch barrier, the storage layer 20, the tunnel barrier layer 30, and the reference layer 40 may be etched to form the variable resistance pattern. Hereinafter, the etched storage layer 20, the etched tunnel barrier layer 30, and the etched reference layer 40 are referred to a storage layer 20A, a tunnel barrier layer 30A, and a reference layer 40A, respectively. The etch process may include a reactive ion etch (RIE) using $Cl_2$ or $CH_3OH$.

When such an ion beam etch process is performed, a re-deposited layer 99A may be easily formed on the sidewalls of the storage layer 20A, the reference layer 40A, the CFB layer (not illustrated), and the under layer 10A, and an electrical short may occur between the storage layer 20A and the reference layer 40A.

At this time, the re-deposited layer 99A may include a metallic polymer material. In order to remove residues formed on the surface of the variable resistance pattern, a radical treatment or plasma treatment may be performed under an oxygen atmosphere. Such a method for oxidizing residues may be used to remove the conductivity of the conductive residues. When such an oxidation process is performed, a dead layer may be formed on the sidewalls of the variable resistance pattern.

Figure 5C:
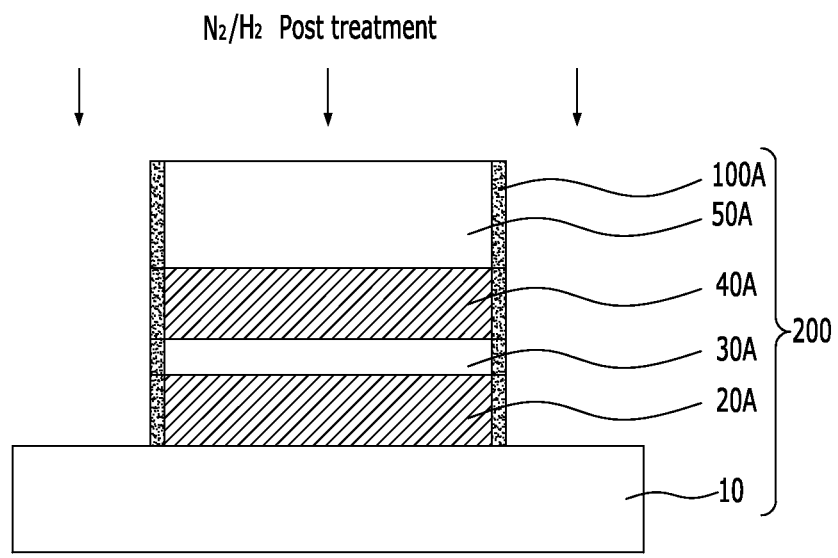

FIG. 5C is a diagram for explaining a process of removing the dead layer and residues.

Referring to FIG. 5C, a reduction region 100A is formed by removing the dead layer formed on the sidewalls of the variable resistance pattern 200 through the oxidation process. Thus, the variable resistance pattern 200 is formed to include the reduction region 100A, the under layer 10A, the storage layer 20A, the tunnel barrier layer 30A, and the reference layer 40A. The reduction region 100A may be formed by a plasma treatment or radical treatment performed on the dead layer using a gas mixture of $H_2$ and $N_2$. Since the dead layer is formed by oxidizing the sidewalls of the variable resistance pattern 200, a reducing gas may be used to remove the dead layer.

Furthermore, the residues may be additionally removed during a removal process of the dead layer. In order to remove the residues, cleaning gas may be used. When a plasma treatment or radical treatment is performed under an atmosphere using a gas mixture of a reducing gas and a cleaning gas, not only the dead layer but also the residues can be removed at the same time. For example, the reducing gas may include $H_2$ to reduce a damaged region, and the cleaning gas may include $H_2$ to remove polymer-based residues. For example, the plasma treatment or radical treatment may be performed under an atmosphere using a gas mixture of $H_2$, $N_2$, and Ar. In this case, Ar gas is used for plasma (or radical) generation and gas carrier, and another inert gas may be used.

Figure 5D:
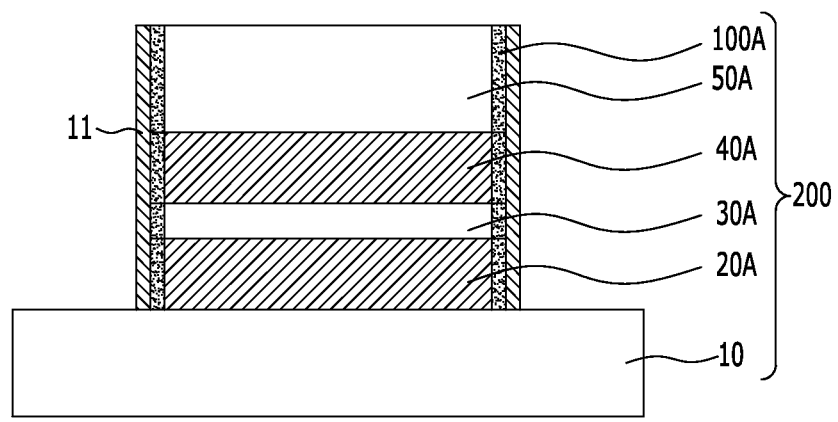

FIG. 5D is a diagram illustrating that a first insulating layer is formed during the fabrication process of a multi-layered passivation layer.

Referring to FIG. 5D, the first insulating layer 11 is formed on the sidewalls of the variable resistance pattern 200. The first insulating layer 11 may be formed in the innermost side.

The first insulation layer 11 may include silicon nitride (SiN). The first insulating layer 11 may be formed through, for example, thermal ALD, plasma ALD, plasma CVD, ion beam deposition (IBD), and sputtering.

Figure 5E:
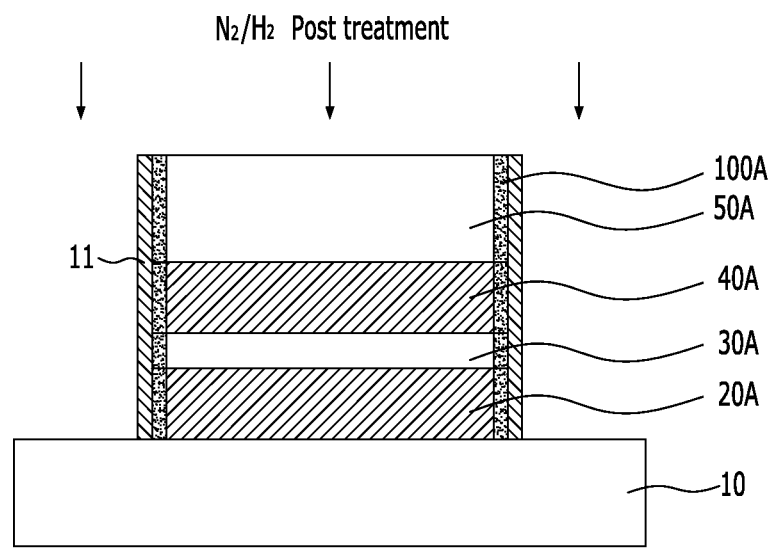

FIG. 5E is a diagram illustrating a process of reducing the impurity concentration of the first insulating layer 11.

Referring to FIG. 5E, the first insulating layer 11 may be post-treated.

For example, the post treatment may be performed through a plasma treatment or radial treatment using $N_2/H_2/Ar$ gas. In this case, Ar gas is used for plasma (or radical) generation and gas carrier, and another inert gas may be used.

Figure 5F:
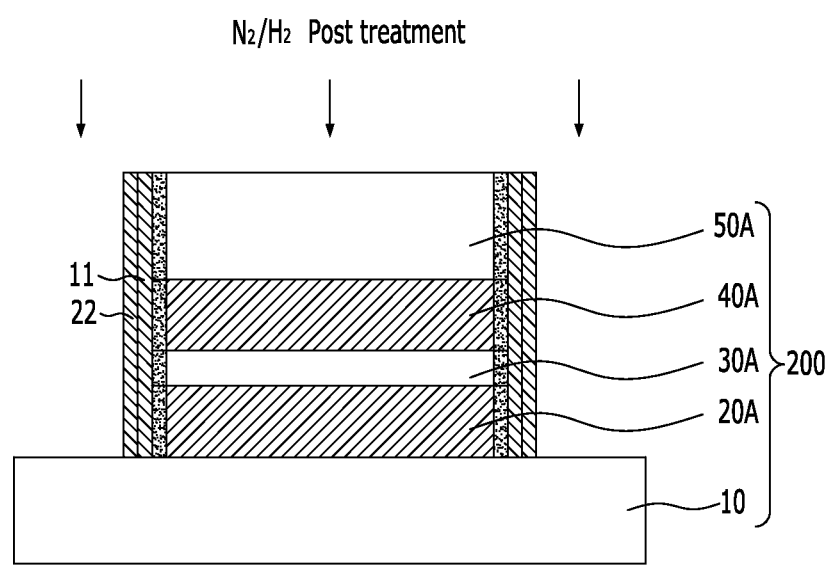

FIG. 5F illustrates that a second insulating layer 22 is formed and a post-treatment is performed to lower the impurity concentration of the second insulating layer 22.

Referring to FIG. 5F, the second insulating layer 22 is formed at outer side of the first insulating layer 11. For example, the second insulating layer 22 is formed at a more remote location than the first insulating layer 11 from the variable resistance element 200. The second insulating layer 22 may be formed of SiN. The second insulating layer 12 may be formed through thermal ALD, plasma ALD, plasma CVD, IBD, and sputtering.

Furthermore, after the second insulating layer 22 is formed, a post-treatment for lowering the impurity concentration may be performed in the same manner as done the first insulating layer 11. For example, the post treatment may be performed through a plasma treatment or radial treatment using $N_2/H_2/Ar$ gas. Thus, the impurity concentration of the first insulating layer 11 as well as the second insulating layer 12 can be additionally lowered. In this way, as the post-treatment for lowering impurity concentration is repeated after the first and second insulating layers 11 and 22 are formed, the impurity concentrations of the first and second insulating layers 11 and 22 may be lowered, and the reduction region 100A may be formed more densely while the dead layer 100 formed on the sidewalls of the variable resistance pattern 200 is repetitively removed.

Figure 5G:
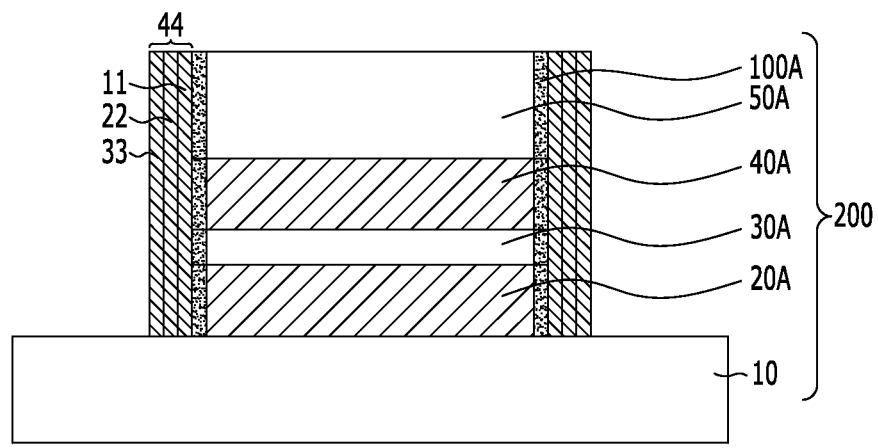

Referring to FIG. 5G, a third insulating layer 33 may be formed. The third insulating layer 33 may be formed of SiN, like the first and second insulating layers 11 and 22. Then, a post-treatment for lowering the impurity concentration may be performed in the same manner. For example, the post treatment may be performed through a plasma treatment or radial treatment using $N_2/H_2/Ar$ gas.

Thus, the area of the reduction region 100A on the sidewalls of the variable resistance pattern 200 is repeatedly reduced, and impurities remaining in the first, second and third insulating layer 11, 22, and 33 can be further removed. In this way, by removing impurities in the insulating layers 11, 22, and 33, the dense multi-layered passivation layer 44 can be formed. Further, by repeatedly reducing the sidewalls of the variable resistance pattern 200, more reliable variable resistance pattern 200 can be provided.

Furthermore, while the concentration of impurities within the insulating layers 11, 22, and 33 is repetitively lowered, the flow rate of $N_2$ in the gas mixture of $N_2$ and $H_2$ may be increased, and the flow rate of $H_2$ in the gas mixture of $N_2$ and $H_2$ may be decreased. That is because, when the plasma treatment or radical treatment is repeated a plurality of times under the same condition, the first insulating layer 11 may be more frequently exposed to $N_2$ gas than the third insulating layer 33, and the impurity concentration of the third insulating layer 33 may be increased. In order to lower the impurity concentration, the flow rate of $N_2$ gas in the entire gas needs to be gradually increased. By doing so, an impurity removal effect for the third insulating layer 33 can be improved during a plasma treatment or radical treatment. Thus, the multi-layer passivation layer 44 may be formed more stably.

The above-described semiconductor device and the method for fabricating the same can be used to provide the following effects.

During the patterning process for the variable resistance pattern 20, residues are formed through a physical etch process. In order to remove such residues, an oxidation is performed but causes the dead layer 100 to form on the sidewalls of the variable resistance pattern 200.

In order to prevent the degradation of the characteristic of the variable resistance pattern 200 due to the dead layer, the process of removing the residues on the sidewalls of the variable resistance pattern 200 and the process of reducing the sidewall are performed.

Furthermore, the multi-layer passivation layer 44 is introduced. In forming the multi-layer passivation layer, the fabrication process of an insulating layer and the post-treatment process for lowering impurity concentration are sequentially and repeatedly performed. Thus, the impurity concentrations of the insulating layers 11, 22, and 33 can be lowered to improve the film quality. Further, since the sidewalls of the variable resistance pattern 200 can be further reduced, more improved reliable variable resistance pattern 200 can be realized.

The above and other memory circuits or semiconductor devices based on the disclosed technology may be used in a range of devices or systems. FIGS. 6-10 provide some examples of devices or systems that may implement the memory circuits disclosed herein.

Figure 6:
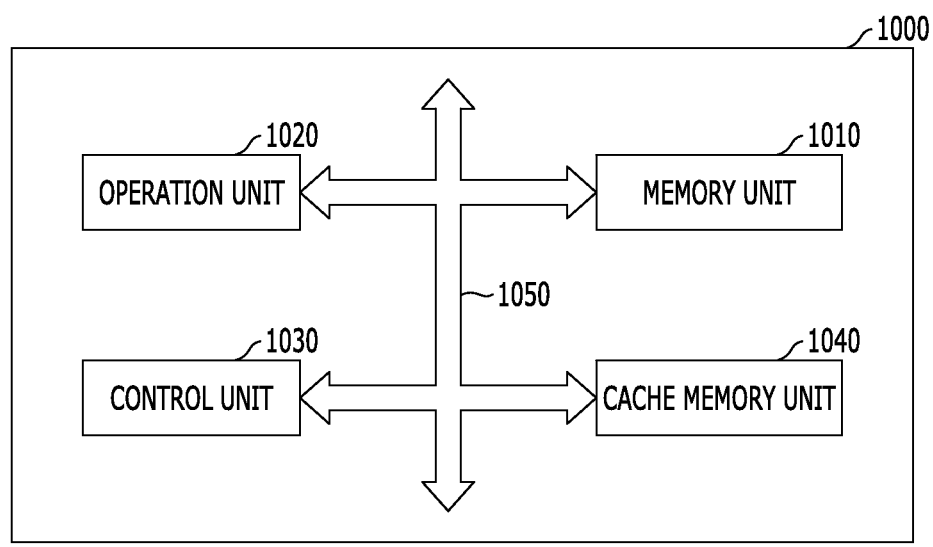
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, the microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described electronic devices in accordance with the implementations. For example, the memory unit 1010 may include a variable resistance pattern formed over a substrate, and a multi-layer passivation layer positioned over sidewalls of the variable resistance pattern and having two or more insulating layers stacked over the sidewalls of the variable resistance pattern. In particular, the insulating layers of the multi-layer passivation layer are formed by repeatedly performing a unit cycle of a deposition and a post-treatment. Through this, the reliability of the memory unit 1010 may be increased. As a consequence, the reliability of integration of the microprocessor 1000 may become easy increased.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
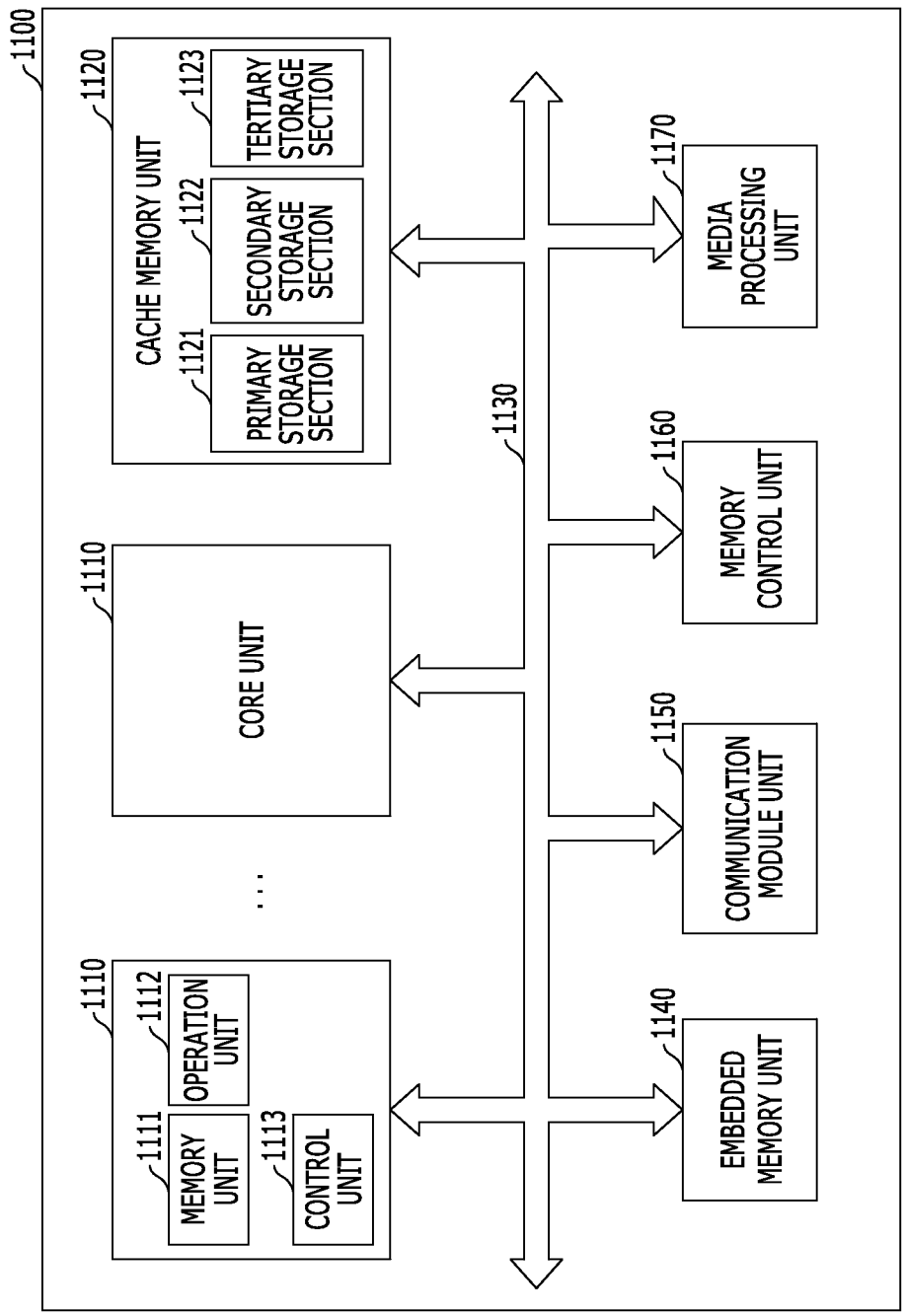
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, the processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest.

At least one storage section of the primary storage section 1121, the secondary storage section 1122 and the tertiary storage section 1123 of the cache memory unit 1120 may include one or more of the above-described electronic devices in accordance with the implementations. For example, the cache memory unit 1120 may include a variable resistance pattern formed over a substrate, and a multi-layer passivation layer positioned over sidewalls of the variable resistance pattern and having two or more insulating layers stacked over the sidewalls of the variable resistance pattern. In particular, the insulating layers of the multi-layer passivation layer are formed by repeatedly performing a unit cycle of a deposition and a post-treatment. Through this, the reliability of the cache memory unit 1120 may be increased. As a consequence, the reliability of integration of the processor 1100 may become easy increased.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
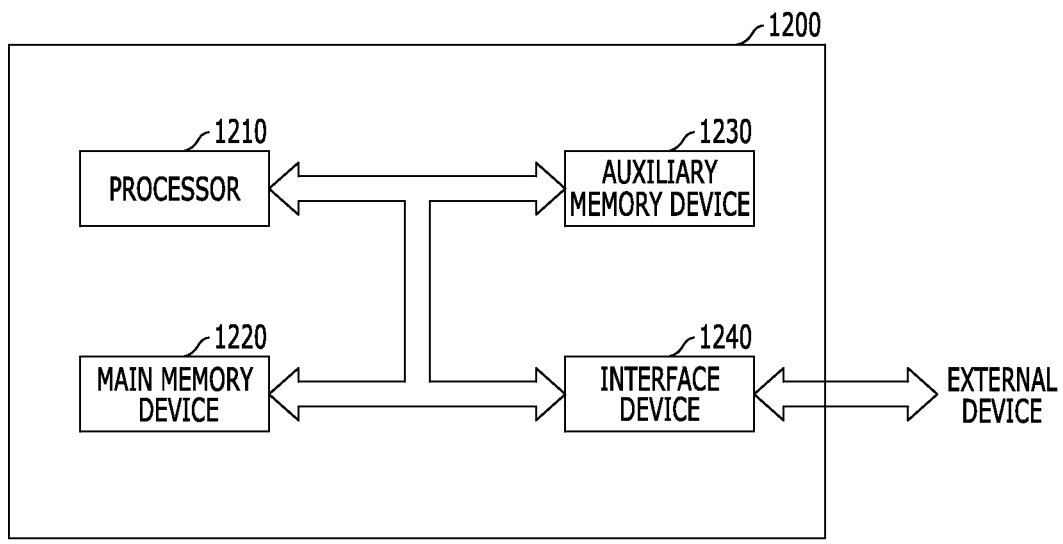
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, the system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described electronic devices in accordance with the implementations. For example, the main memory device 1220 may include a variable resistance pattern formed over a substrate, and a multi-layer passivation layer positioned over sidewalls of the variable resistance pattern and having two or more insulating layers stacked over the sidewalls of the variable resistance pattern. In particular, the insulating layers of the multi-layer passivation layer are formed by repeatedly performing a unit cycle of a deposition and a post-treatment. Through this, the reliability of the main memory device 1220 can be increased. As a consequence, the reliability of integration of the system 1200 may become easy increased.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the electronic devices according to the implementations, but may include a static random access memory (SRAM), a dynamic random access memory (DRAM), and so on, of a volatile memory type in which all contents are erased when power supply is cut off. The auxiliary memory device 1230 is a memory device for storing program codes or data. While the speed of the auxiliary memory device 1230 is slower than the main memory device 1220, the auxiliary memory device 1230 can store a larger amount of data.

The auxiliary memory device 1230 may include one or more of the above-described electronic devices in accordance with the implementations. For example, the auxiliary memory device 1230 may include a variable resistance pattern formed over a substrate, and a multi-layer passivation layer positioned over sidewalls of the variable resistance pattern and having two or more insulating layers stacked over the sidewalls of the variable resistance pattern. In particular, the insulating layers of the multi-layer passivation layer are formed by repeatedly performing a unit cycle of a deposition and a post-treatment. Through this, the reliability of the auxiliary memory device 1230 can be increased. As a consequence, the reliability of integration of the system 1200 may become easy increased.

Also, the auxiliary memory device 1230 may further include a data storage system (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the electronic devices according to the implementations, but may include data storage systems (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
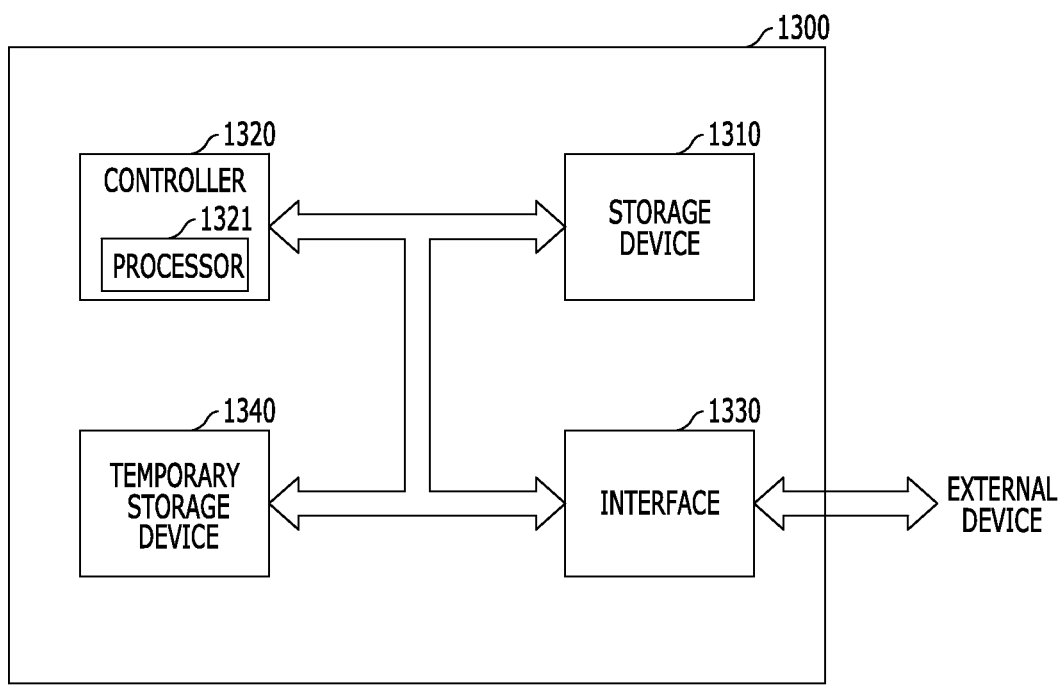
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, the data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. Any of the storage device 1310 and the temporary storage device 1340 for temporarily storing data may include one or more of the above-described electronic devices in accordance with the implementations. The storage device 1310 or the temporary storage device 1340 may include a variable resistance pattern formed over a substrate, and a multi-layer passivation layer positioned over sidewalls of the variable resistance pattern and having two or more insulating layers stacked over the sidewalls of the variable resistance pattern. In particular, the insulating layers of the multi-layer passivation layer are formed by repeatedly performing a unit cycle of a deposition and a post-treatment. Through this, the reliability of the storage device 1310 and the temporary storage device 1340 can be reduced. As a consequence, a data storage characteristic of the data storage system 1300 may become easy improved.

Figure 10:
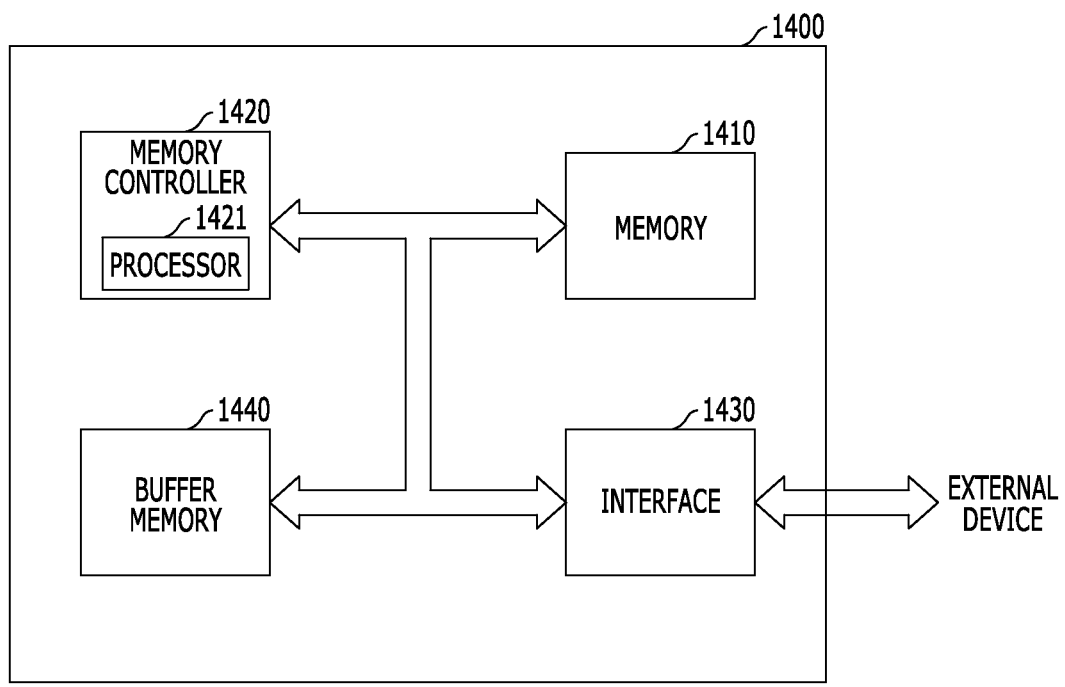
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, the memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described electronic devices in accordance with the implementations. For example, the memory 1410 may include a variable resistance pattern formed over a substrate, and a multi-layer passivation layer positioned over sidewalls of the variable resistance pattern and having two or more insulating layers stacked over the sidewalls of the variable resistance pattern. In particular, the insulating layers of the multi-layer passivation layer are formed by repeatedly performing a unit cycle of a deposition and a post-treatment. Through this, the reliability of the memory 1410 can be increased. As a consequence, a data storage characteristic of the memory system 1400 may become easy improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described electronic devices in accordance with the implementations. The buffer memory 1440 may include a variable resistance pattern formed over a substrate, and a multi-layer passivation layer positioned over sidewalls of the variable resistance pattern and having two or more insulating layers stacked over the sidewalls of the variable resistance pattern. In particular, the insulating layers of the multi-layer passivation layer are formed by repeatedly performing a unit cycle of a deposition and a post-treatment. Through this, the reliability of the buffer memory 1440 can be increased. As a consequence, a data storage characteristic of the memory system 1400 may become easy improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the electronic devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

In accordance with the implementations, the multi-layer passivation layer having an improved film quality may be formed to improve the reliability of the variable resistance pattern.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations may be made based on what is described and illustrated in this patent document.

What is claimed is:

1. An electronic device comprising a semiconductor memory device that comprises:
    a variable resistance element formed over a substrate; and
    a multi-layer passivation layer positioned over sidewalls of the variable resistance element and having two or more insulating layers formed over the sidewalls of the variable resistance element,
    wherein among the two or more insulating layers of the multi-layer passivation layer, a first insulating layer of the multi-layer passivation layer has a first impurity concentration higher than a second impurity concentration of a second insulating layer positioned closer than the first insulation layer to the variable resistance element.

2. The electronic device according to claim 1, wherein the two or more insulating layers include a nitride.

3. The electronic device according to claim 1, wherein each insulating layer includes a thin film formed through a deposition and a post-treatment.

4. The electronic device according to claim 1, wherein the variable resistance element comprises a stacked layer of two magnetic layers and a tunnel barrier layer interposed therebetween.

5. The electronic device according to claim 1, wherein the variable resistance element comprises a metal oxide.

6. The electronic device according to claim 1, wherein the variable resistance element comprises a phase change material.

7. The electronic device according to claim 1, wherein the two or more insulating layers comprise a silicon nitride.

8. The electronic device according to claim 1, wherein:
    the variable resistance element includes different layers that are formed over the substrate and are parallel to the substrate, and
    the two or more insulating layers are perpendicular to the different layers of the variable resistance element.

9. The electronic device according to claim 8, wherein the two or more insulating layers have a total thickness smaller than a total thickness of the different layers of the variable resistance element.

10. The electronic device according to claim 1, wherein the semiconductor memory device further includes a reduction layer between each sidewall of the variable resistance element and the multi-layer passivation layer.

11. The electronic device according to claim 1, further comprising a microprocessor which includes:
    a control unit configured to receive a signal including a command from an outside of the microprocessor, and performs extracting, decoding of the command, or controlling input or output of the microprocessor;
    an operation unit configured to perform an operation based on a result that the control unit decodes the command; and
    a memory unit configured to store data for performing the operation, data corresponding to a result of performing the operation, or an address of data upon which the operation is performed,
    wherein the semiconductor memory device that includes the variable resistance element is a part of the memory unit in the microprocessor.

12. The electronic device according to claim 1, further comprising a processor which includes:
    a core unit configured to perform, based on a command inputted from an outside of the processor, an operation corresponding to the command;
    a cache memory unit configured to store data for performing the operation, data corresponding to a result of performing the operation, or an address of data upon which the operation is performed; and
    a bus interface connected between the core unit and the cache memory unit, and configured to transmit data between the core unit and the cache memory unit,
    wherein the semiconductor memory device that includes the variable resistance element is a part of the cache memory unit in the processor.

13. The electronic device according to claim 1, further comprising a processing system which includes:
    a processor configured to decode a command received by the processor and control an operation based on a result of decoding the command;
    an auxiliary memory device configured to store a program for decoding the command and information;
    a main memory device configured to call and store the program and the information from the auxiliary memory device such that the processor can perform the operation using the program and the information when executing the program; and
    an interface device configured to perform communication between at least one of the processor, the auxiliary memory device, the main memory device and the outside,
    wherein the semiconductor memory device that includes the variable resistance element is a part of the auxiliary memory device or the main memory device in the processing system.

14. The electronic device according to claim 1, further comprising a data storage system which includes:
    a storage device configured to store data and maintain stored data regardless of a power supply;
    a controller configured to control input and output of data to and from the storage device according to a command inputted from an outside;
    a temporary storage device configured to temporarily store data exchanged between the storage device and the outside; and
    an interface configured to perform communication between at least one of the storage device, the controller, and the temporary storage device and the outside,
    wherein the semiconductor memory device that includes the variable resistance element is a part of the storage device or the temporary storage device in the data storage system.

15. The electronic device according to claim 1, further comprising a memory system which includes:
    a memory configured to store data and maintain stored data regardless of a power supply;
    a memory controller configured to control input and output of data to and from the memory according to a command inputted from an outside;
    a buffer memory configured to buffer data exchanged between the memory and the outside; and
    an interface configured to perform communication between at least one of the memory, the memory controller, and the buffer memory and the outside, wherein the semiconductor memory device that includes the variable resistance element is a part of the memory or the buffer memory in the memory system.

\* \* \* \* \*